United States Patent [19]
Chiang

[11] Patent Number: 5,863,805
[45] Date of Patent: Jan. 26, 1999

[54] METHOD OF PACKAGING SEMICONDUCTOR CHIPS BASED ON LEAD-ON-CHIP (LOC) ARCHITECTURE

[75] Inventor: Cheng-Lien Chiang, Taipei, Taiwan

[73] Assignee: Industrial Technology Research Institute, Taiwan

[21] Appl. No.: 691,678

[22] Filed: Aug. 2, 1996

[51] Int. Cl.[6] .................................................. H01L 21/60
[52] U.S. Cl. .......................... 437/220; 437/209; 437/217; 437/219
[58] Field of Search ..................................... 437/209, 211, 437/212, 214, 215, 216, 217, 218, 219, 220

[56] References Cited

U.S. PATENT DOCUMENTS

| | | | |
|---|---|---|---|
| 5,086,018 | 2/1992 | Conru et al. | 437/220 |
| 5,229,329 | 7/1993 | Chai et al. | 437/220 |
| 5,258,331 | 11/1993 | Masumoto et al. | 437/220 |
| 5,352,633 | 10/1994 | Abbott | 437/209 |
| 5,363,279 | 11/1994 | Cha | 361/767 |
| 5,378,656 | 1/1995 | Kajihara et al. | 437/209 |
| 5,428,248 | 6/1995 | Cha | 252/676 |
| 5,430,500 | 7/1995 | Hoshino et al. | 348/701 |
| 5,441,918 | 8/1995 | Morisaki et al. | 432/209 |

*Primary Examiner*—Kevin Picardat
*Attorney, Agent, or Firm*—Bacon & Thomas

[57] ABSTRACT

A method is devised for packaging semiconductor chips based on a lead-on-chip (LOC) architecture which allows the size of the package to be substantially close to the chip size so as to reduce the packaging size to the minimum. The semiconductor chip is mounted based on a lead-on-chip architecture on a leadframe having a plurality of leads, a side rail, and at least a first connecting piece and a second connecting piece. In this method, the first step is to attach a ring to the leadframe. Then, the semiconductor chip is mounted on the leadframe and a plurality of wires are interconnected between the bonding pads on the semiconductor chip and the leads on leadframe. After that, a liquid epoxy is applied to the semiconductor chip so as to form a molding compound encapsulating the semiconductor chip. Finally, the side rail of the leadframe is removed from the leadframe. The step of encapsulation can be implemented either by epoxy dispensing or by print encapsulation system (PES). Compared to prior art methods, the foregoing method excludes the dambar cut and lead forming steps and uses small-scale encapsulating equipment. These benefits allows the IC packages to be more reliable and made with less manufacturing cost.

24 Claims, 24 Drawing Sheets

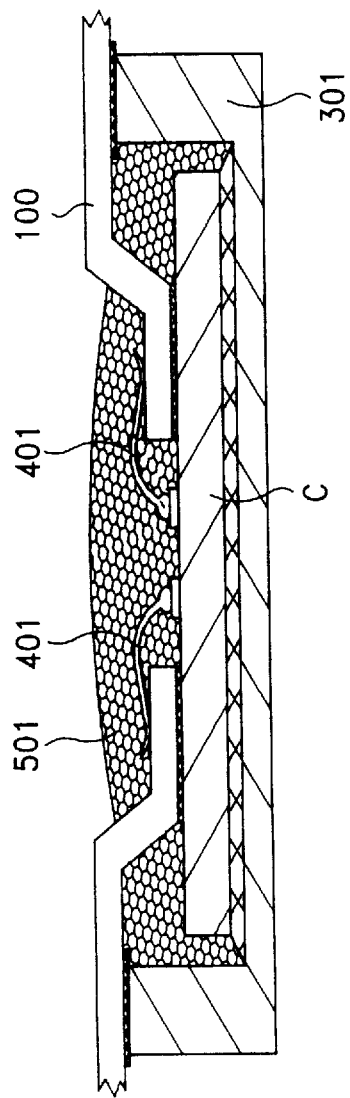

METHOD OF PACKAGING SEMICONDUCTOR CHIPS BASED ON LEAD-ON-CHIP (LOC) ARCHITECTURE

BACKGROUND OF THE INVENTION

1. Field of the Invention

This invention relates to technologies for packaging semiconductor chips, and more particularly, to a method for packaging semiconductor chips based on a lead-on-chip (LOC) architecture which allows the size of the IC package to be substantially close to the chip size so as to reduce the packaging size to the minimum.

2. Description of Related Art

In the semiconductor industry, the objective of making the IC packages as small as possible is always a primary concern. Related technologies include the small outline package (SOP), the small J-lead package (SOJ), the thin small outline package (TSOP), and so on. These technologies are all based on a lead-on-chip (LOC) architecture which allows the packaging to be made with a smaller molding compound encapsulating the semiconductor chip. The overall size of the IC package can thus be made as small as close to the chip size.

However, the SOP, SOJ, and even the TSOP architecture still use the transfer molding technology for the encapsulation. If a molding compound is to be made very thin, the channel therein for directing epoxy is correspondingly small. As a consequence, the molding compound can hardly made to a thickness less than 1.0 mm. Furthermore, with small channels forceful thrust is required to flow the epoxy through the channels. This could cause the die paddles to be shifted in such manners as to cause the bonding wires to be exposed to the outside of the molding compound or to cause them to be displaced and thus short-circuited.

In packaging a semiconductor chip, a leadframe having a plurality of leads thereon is used to support the semiconductor chip. A plurality of bonding wires, typically gold wires, are then used to interconnect the leads on the leadframe to the bonding pads on the semiconductor chip. In conventional types of packaging, the leads are drawn out of the molding compound from the lateral sides, which causes the footprint area of the IC package to be larger than the molding compound. Even though current technologies can make the molding compound very small, the laterally extended leads still cause the overall IC package to take up a large footprint area.

Solutions to the foregoing problem include a chip-on-lead (COL) type of package disclosed in U.S. Pat. No. 5,428,248, an LOC type of package disclosed in U.S. Pat. No. 5,363,279, and another COL type of package disclosed in U.S. Pat. No. 5,430,500. The COL types of packages, in particular, draw the leads out of the molding compound from the bottom side so as to reduce the overall footprint area of the IC package. However, these technologies notwithstanding utilize the transfer molding technology for encapsulation of semiconductor chips. The aforementioned drawbacks still exist in these types of packages.

SUMMARY OF THE INVENTION

It is therefore a primary objective of the present invention to provide a method for packaging semiconductor chips based on a lead-on-chip (LOC) architecture which allows the size of the package to be substantially close to the chip size so as to reduce the packaging size to the minimum.

In accordance with the foregoing and other objectives of the present invention, a new and improved method for packaging semiconductor chips is provided. In this method, the semiconductor chip being mounted based on a lead-on-chip architecture on a leadframe having a plurality of leads, a side rail, at least a first connecting piece and a second connecting piece. The method includes a first step of ring attachment in which a ring is attached to the leadframe; a second step of die mounting in which the semiconductor chip is mounted on the leadframe; a third step of wire bonding in which a plurality of wires are interconnected between the semiconductor chip and the leadframe; a fourth step of encapsulation in which a liquid epoxy is applied to the semiconductor chip so as to form a molding compound which encloses the semiconductor chip; and a fifth step of component punch-out in which the side rail is removed from the leadframe. In the foregoing method, the fourth step of encapsulation is implemented either by epoxy dispensing or by print encapsulation system (PES).

Compared to prior art methods, the foregoing method excludes the dambar cut and lead forming steps and uses small-scale encapsulating equipment. These benefits allows the manufacturing of the IC packages made by the method of the present invention to be much less costly while much more reliable than the prior art.

BRIEF DESCRIPTION OF DRAWINGS

The present invention can be more fully understood by reading the subsequent detailed description of the preferred embodiments thereof with references made to the accompanying drawings, wherein:

FIG. 13B is a sectional view of another type of IC package manufactured using the method of the present invention;

DETAILED DESCRIPTION OF PREFERRED EMBODIMENT

The objective of the present invention is to provide a method for packaging semiconductor chips which allows the packaging size to be substantially close to the chip size. The present invention includes three aspects: the leadframe structure, the packaging, and the manufacture process.

In order to accommodate as larger as possible a semiconductor chip in a fixed packaging size, the leadframe should has three features: based on LOC architecture, provided with no die paddles, and allow the leads to be directly bonded to the semiconductor chip. These features allow the molding compound to be made smaller. Various types of semiconductor chips usually require dedicated types of leadframes to mount them. It is difficult to come out with a single type of leadframe that can mount various types of semiconductor chips. When an LOC type of leadframe is used, since the leads is extended over the surface of the semiconductor chip, the size of the semiconductor chip is not limited by the size of die paddles. Moreover, since the semiconductor chip is secured by adhesive tapes on the leads, the I/O pads on the semiconductor chip are preferably arranged in rows in the center for convenient testing and alignment of the adhesive tapes.

Therefore, in an LOC type of packaging, the arrangement of the I/O pads in the center substantially allows a single type of leadframe to mount at least some particular types of semiconductor chips as 16M DRAM chips and 4M SRAM chips.

Figure 1:
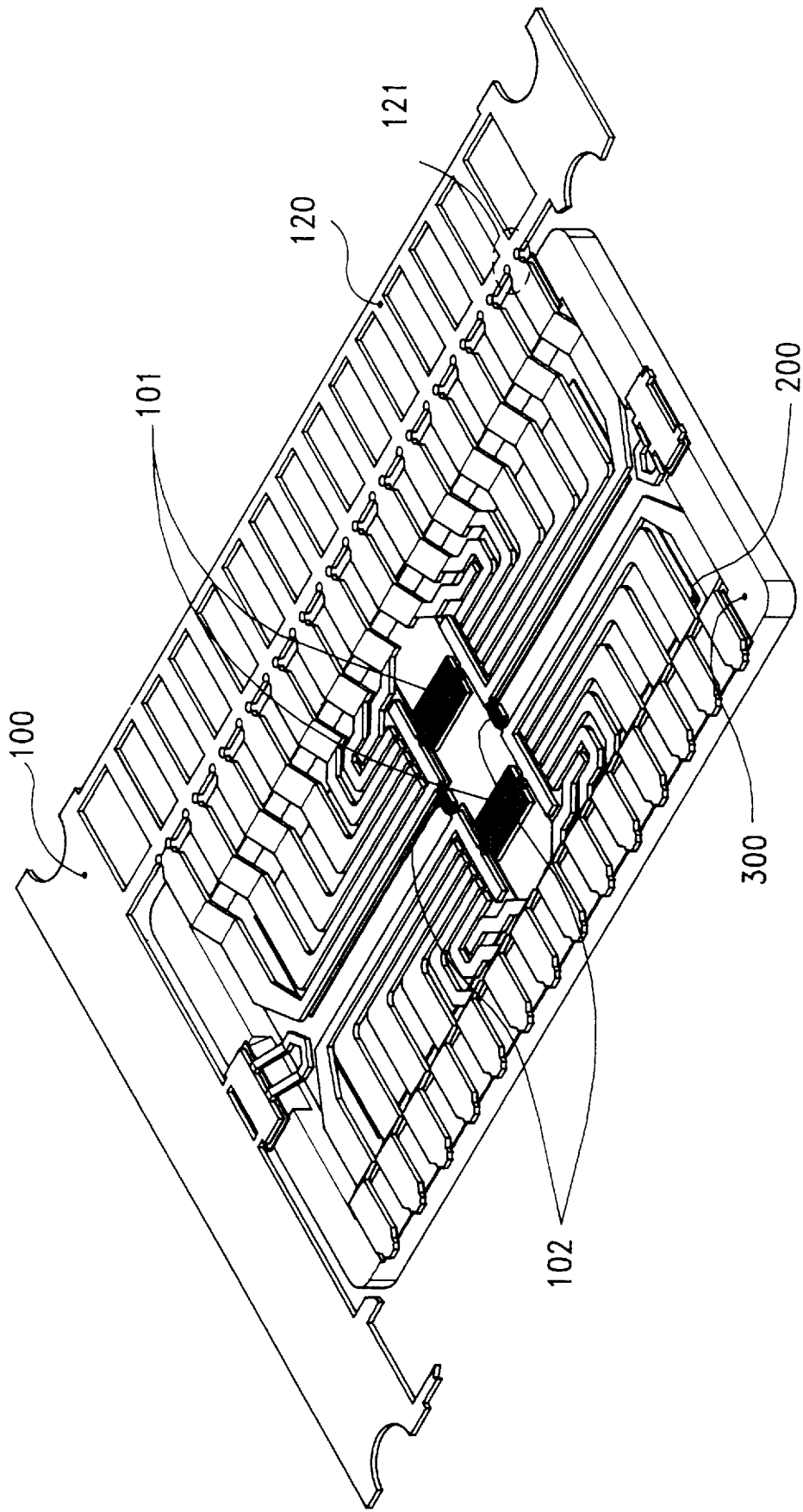
FIG. 1 is a perspective view of a leadframe.

Accordingly in the present invention, a leadframe 100 as shown in FIG. 1 is utilized for LOC type of packaging of semiconductor chips. The leadframe 100 has a plurality of leads which are attached to a ring 300 by means of an adhesive tape 200. The leadframe 100 further includes a side rail 120, a first connecting piece 101, and a second connecting piece 102. A plurality of circular cutaway portions 121 are formed between the leads and the side rail 120. These circular cutaway portions 121 allows the side rail 120 to be easily cut apart from the leadframe 100 when the packaging is completed (this process will be described in detail later in this specification). The ring 300 can be a separate member made of plastics or metal, or alternatively formed by means of dispensing an epoxy resin of high viscosity near the circular cutaway portion 121.

The first and second connecting pieces 101, 102 can be selectively removed in accordance with the arrangement of I/O pads and power/ground connections on the semiconductor chip.

Figure 2A:
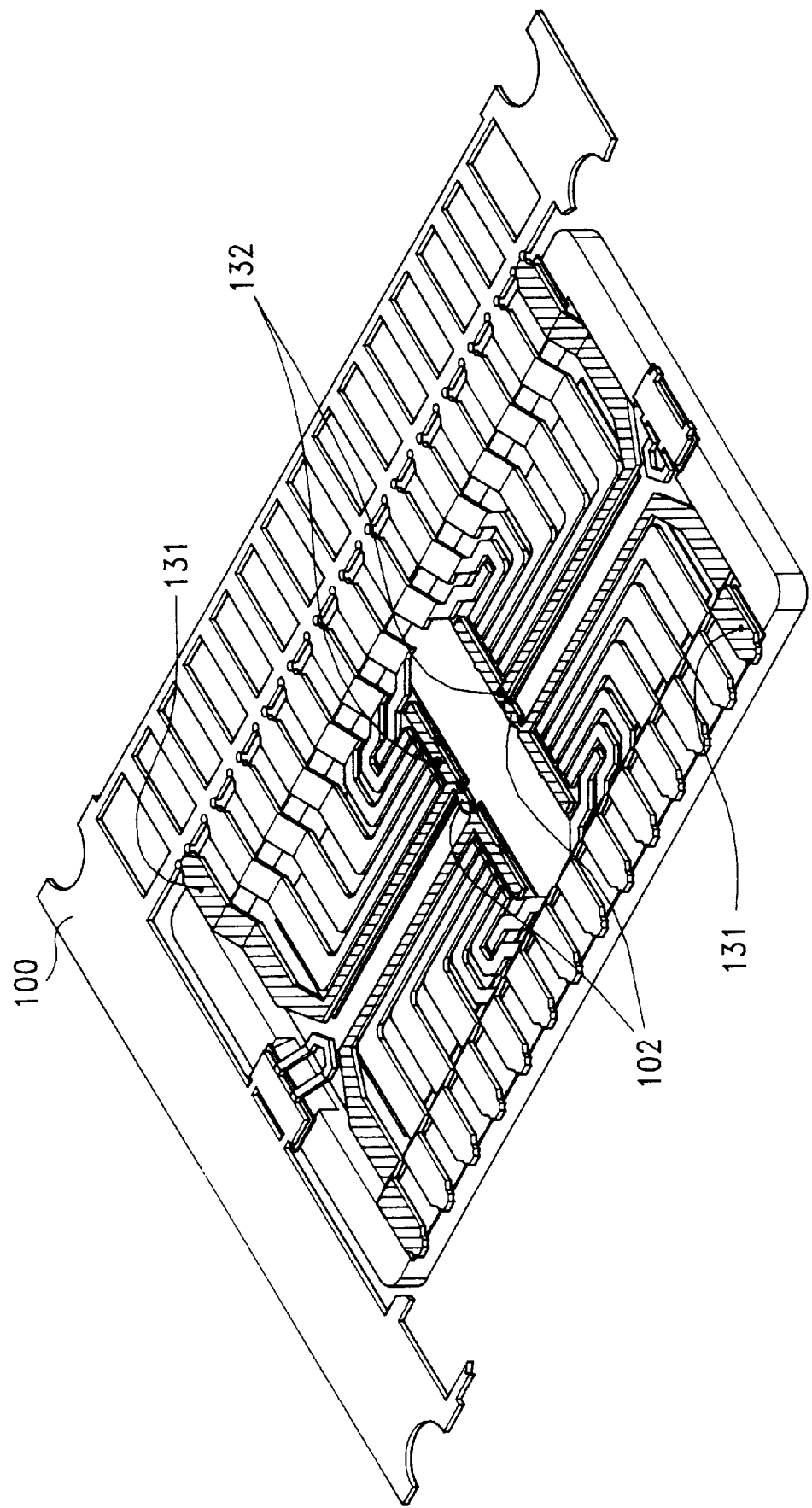
FIG. 2A is a perspective view of the leadframe of FIG. 1 when a first connecting piece thereof is removed.
Figure 2B:
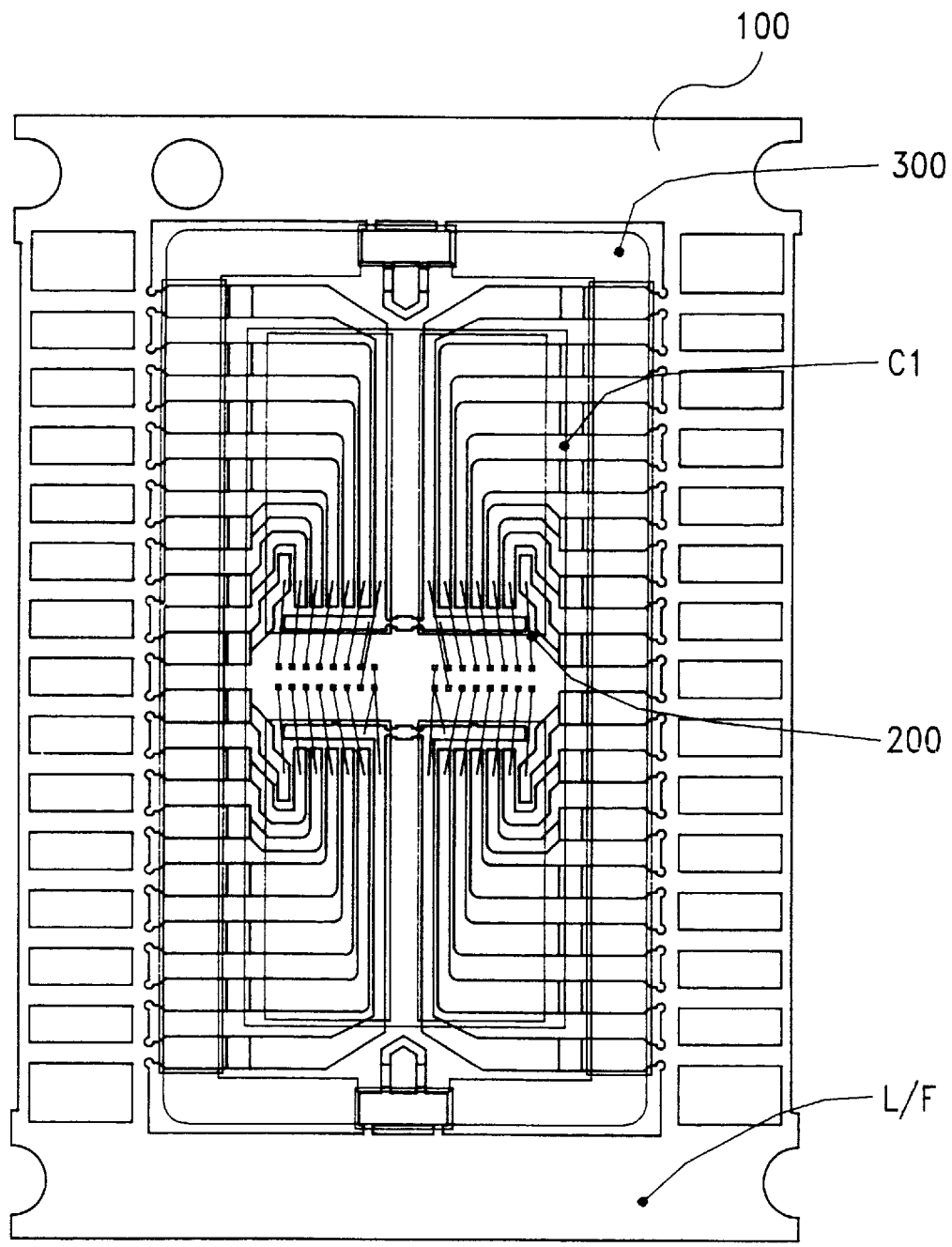
FIG. 2B is a top plan view of the leadframe of FIG. 2A.

For example, FIG. 2A shows the leadframe 100 in which the first connecting piece 101 is cut away. The shaded area 131 designates one lead on the leadframe that is particularly used for enhanced power/ground connections in which a power bus 132 is formed via the second connecting piece 102. The leadframe 100 shown here is suitable for use to mount a semiconductor chip, for example as that designated by C1 in FIG. 2B, that has the I/O pads thereon arranged crosswise in two rows about the crosswise center line of the semiconductor chip. The layout of the bonding wires interconnecting the leads on the leadframe 100 and the I/O pads on the semiconductor chip C1 is illustrated in FIG. 2B.

Figure 3A:
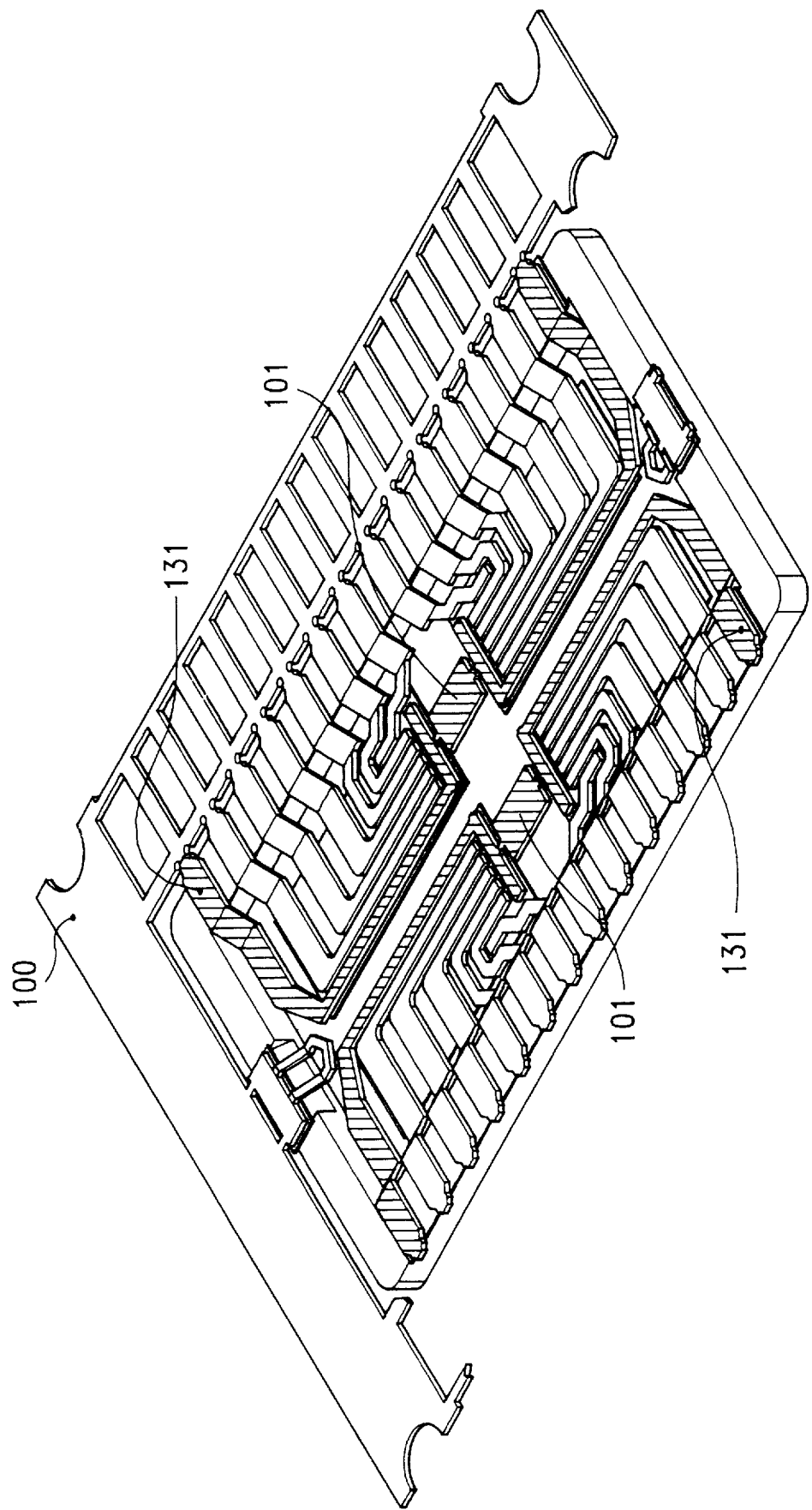
FIG. 3A is a top plan view of the leadframe of FIG. 1 when a second connecting piece thereof is removed.
Figure 3B:
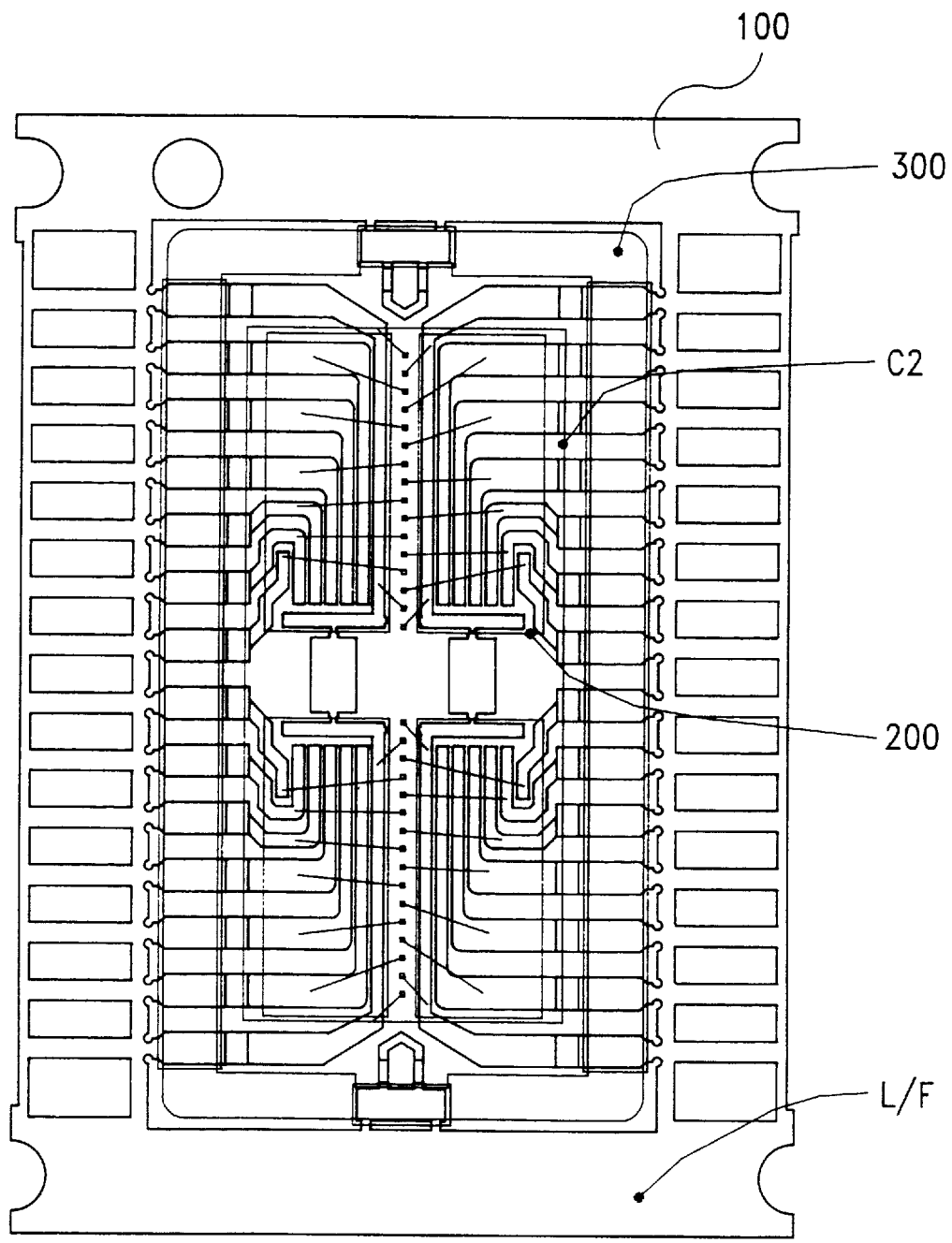
FIG. 3B is a top plan view of the leadframe of FIG. 3A.

Moreover, FIG. 3A shows the leadframe 100 in which the second connecting piece 102 is cut away for enhanced power/ground and signal transmission connections. The leadframe 100 shown here is suitable for use to mount a semiconductor chip, for example as that designated by C2 in FIG. 3B, that has the I/O pads thereon arranged in one single row along the lengthwise center line of the semiconductor chip C2. The layout of the bonding wires interconnecting the leads on the leadframe 100 and the I/O pads on the semiconductor chip C2 is illustrated in FIG. 3B. For semiconductor chips having their I/O pads not arranged on the border, the design shown here particularly allows easy modification, adaptability, and low-cost to the leadframe. Moreover, the wire bonding loop high can be made to the minimum.

Figure 4A:
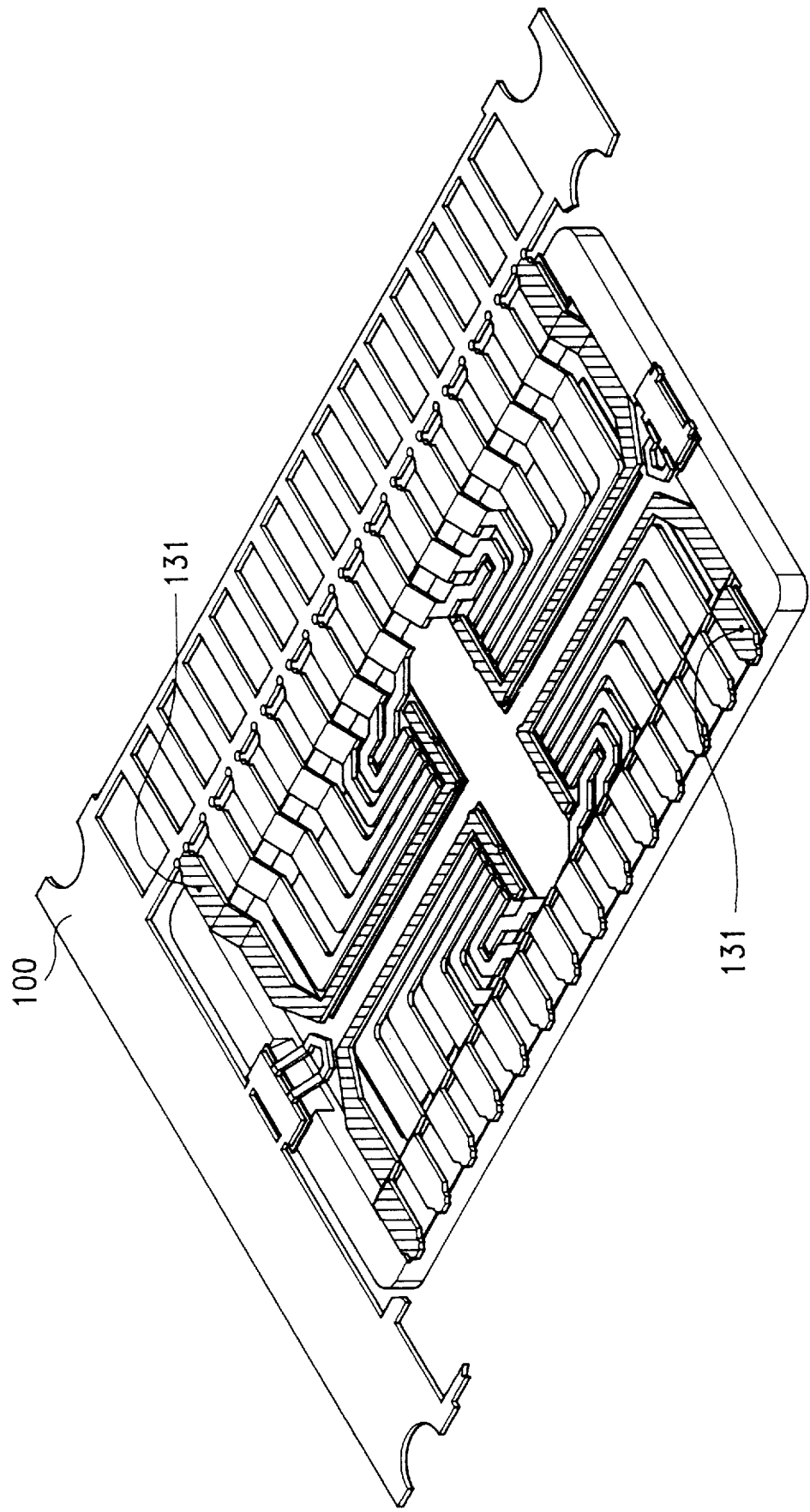
FIG. 4A is a perspective view of the leadframe of FIG. 1 when the first and second connecting pieces thereof are both removed.
Figure 4B:
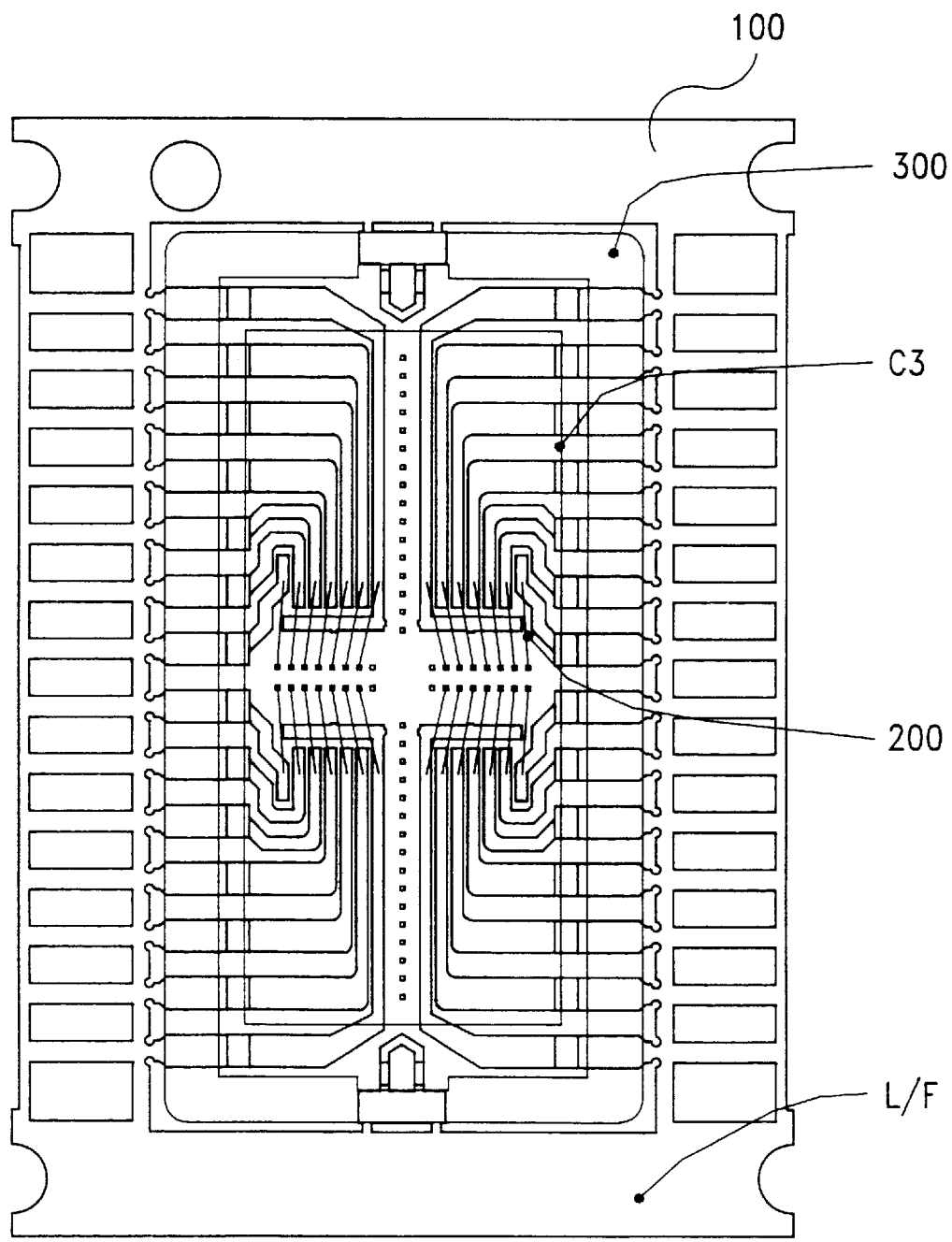
FIG. 4B is a top plan view of the leadframe of FIG. 4A.

Still further, FIG. 4A shows the leadframe 100 in which the first and second connecting pieces 101, 102 are both cut away. The shaded area 131 designates one lead on the leadframe that is particularly used for enhanced power/ground connections. The leadframe 100 shown here is suitable for use to mount a semiconductor chip which has no special arrangement of its I/O pads. The layout of the bonding wires interconnecting the leads on the leadframe 100 and the I/O pads on the semiconductor chip C1 is illustrated in FIG. 4B.

Figure 5:
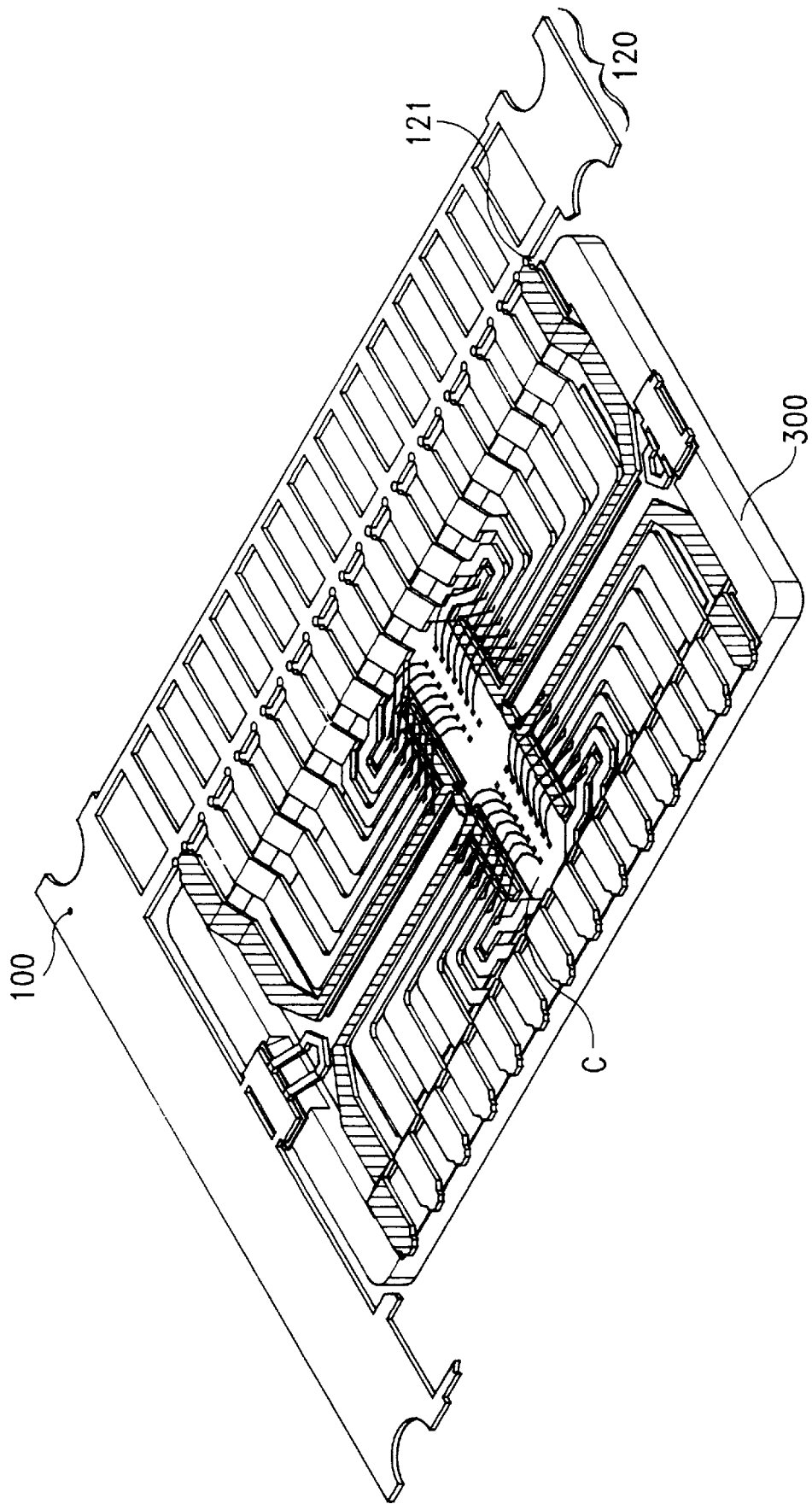
FIG. 5 is a perspective view showing the mounting of a semiconductor chip on the leadframe.
Figure 6:
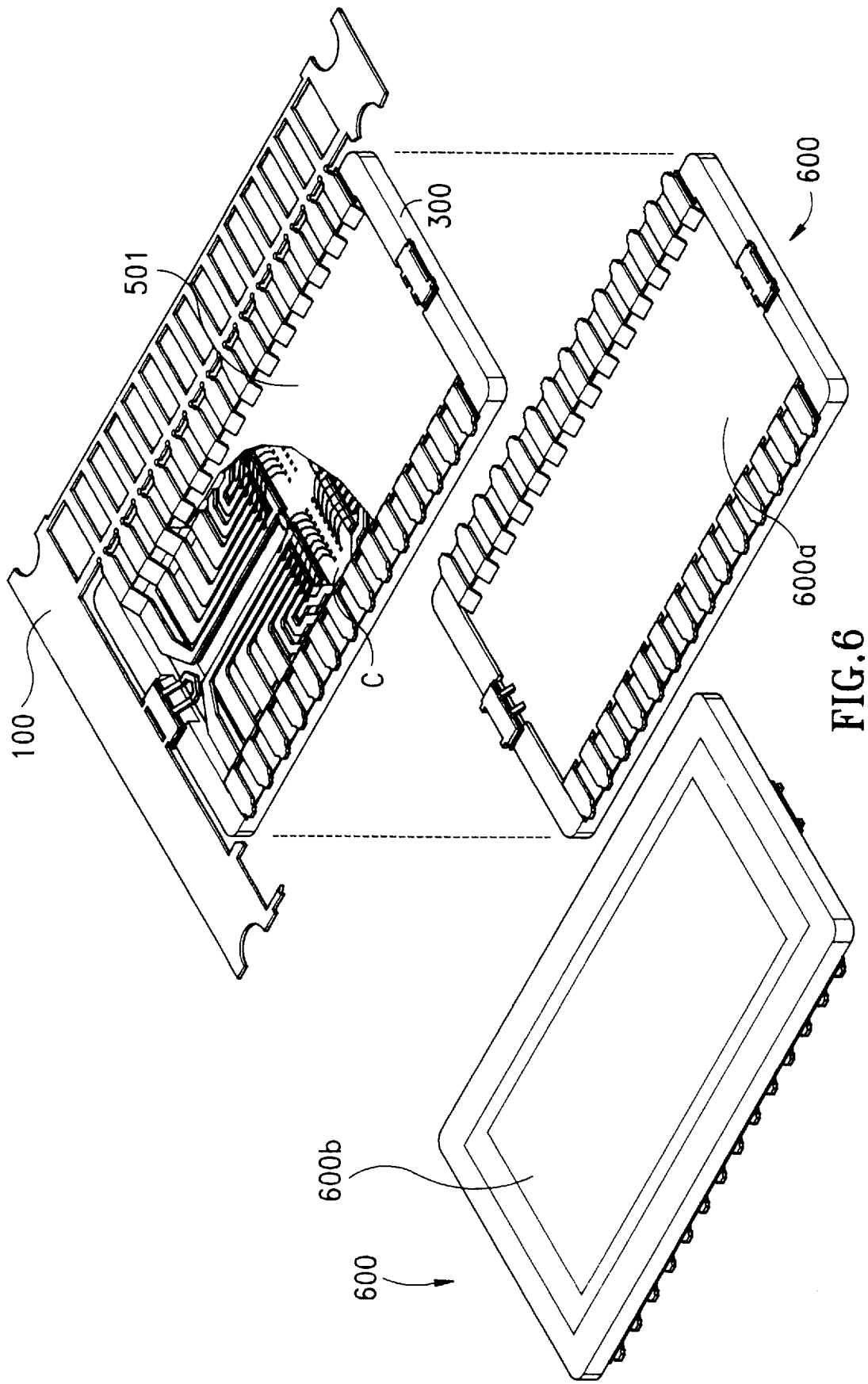
FIG. 6 is a perspective view of an IC package which is packaged using the method of the present invention.
Figure 13A:
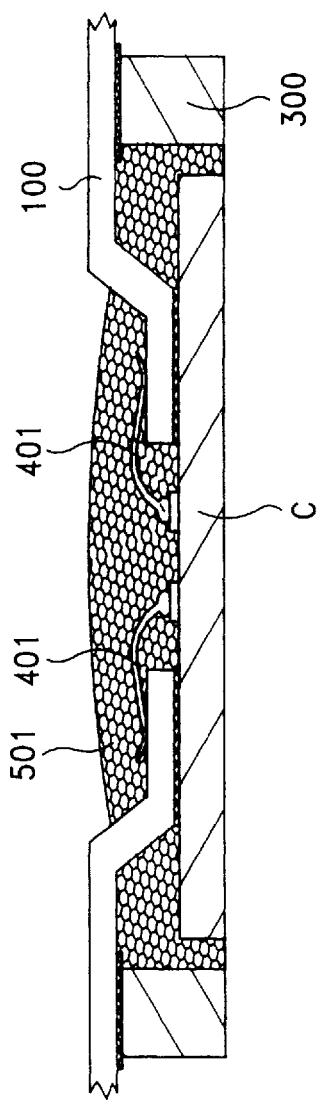
FIG. 13A is a sectional view of an IC package manufactured using the method of the present invention.
Figure 14:
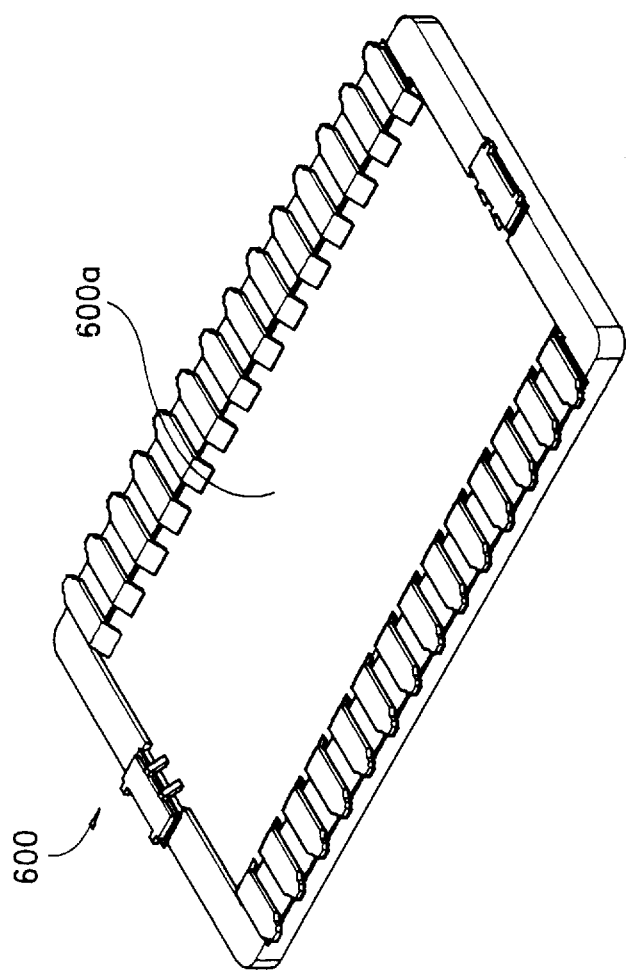
FIG. 14 is a bottom view of an IC package.
Figure 15:
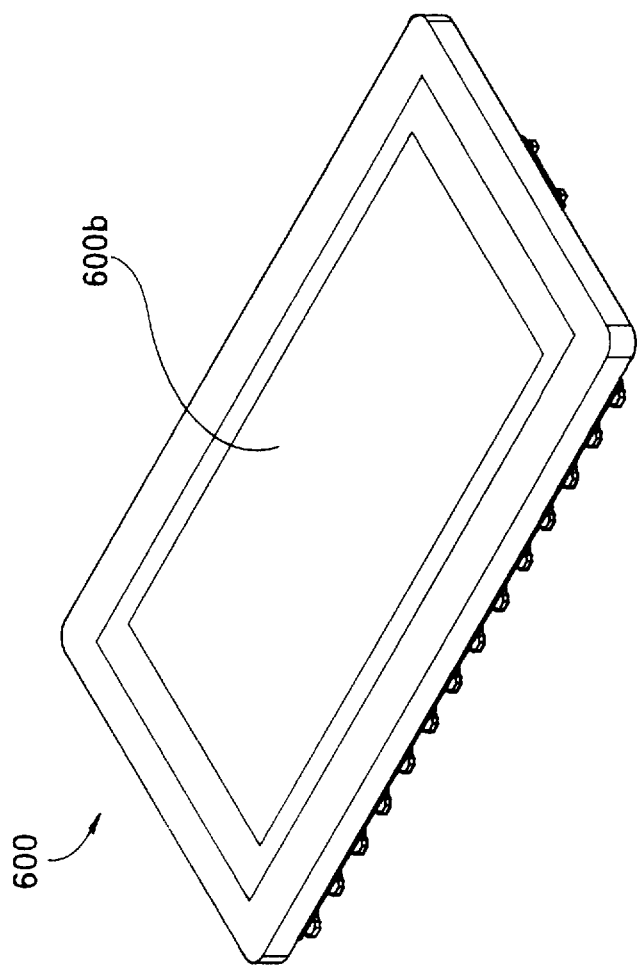
FIG. 15 is a top view of an IC package.

FIG. 5 shows a wire bonding structure that allows a lengthier pitch between two adjacent bonding pads such that the wire bonding loop high can be made to the minimum. As described earlier, the leadframe 100 is attached with the ring 300 on its leads. It is a characteristic part of the present invention that, after undergoing die mounting and wire bonding processes (which will be described in detail later in this specification), an epoxy dispensing or a screen printing technique is used to apply a resin into the ring 300. The resin will be thus formed into a molding compound 501 which encapsulates the semiconductor chip. After that, the circular cutaway portions 121 in the leadframe 100 allows easier removal of the side rail 120 from the leadframe 100 after the encapsulation is completed. An IC package 600 is thus made. FIG. 6 is a bottom view of the IC package 600 particularly showing its bottom side 600a (an enlarged view is further shown in FIG. 14) where the leads are extended out of the molding compound 501. The top side of the IC package 600 is indicated by 600b (an enlarged view is further shown in FIG. 15). FIG. 13A shows a sectional view of the IC package 600. The characteristic part of the present invention briefly described here allows the IC package 600 to be more reliable and have a less footprint size than IC packages made by prior art methods.

Figure 16:
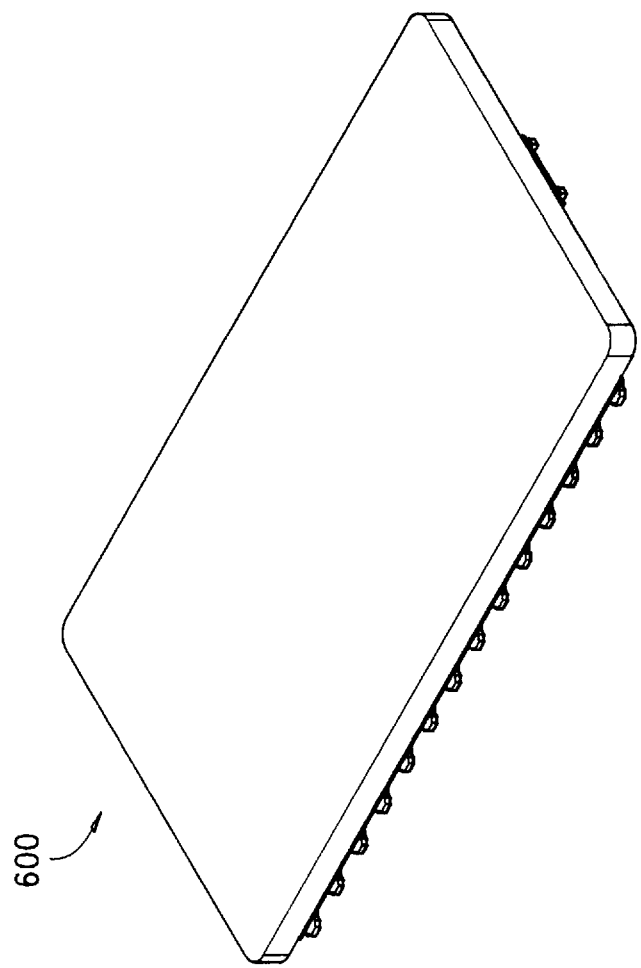
FIG. 16 is a top view of an IC package.

The foregoing type of packaging is referred to as a "ring-type of packaging". If a cap 301 is used instead of the ring 300, the packaging is referred to as a "cap-type of packaging" which has a bottom view shown in FIG. 14, a top view shown in FIG. 16, and a sectional view shown in FIG. 13B.

The use of the epoxy dispensing or screen printing technique instead of the transfer molding technique allows the molding compound in the IC package to be further downsized to a level allowing a chip-size package. It also allows substantial elimination of the drawbacks of die-paddle shift, wire sweep, component wrappage, and forming of voids.

The method of the present invention which utilizes the epoxy dispensing or screen printing technique instead of the transfer molding technique for packaging a semiconductor chip will be described in full detail in the following with reference to FIG. 7. The method includes the following steps:

Step 1: Ring Attachment

Step 2: Die Mounting

Step 3: Wire Bonding

Step 4: Encapsulation

Step 5: Component Punch-out

Steps 1 and 2

Ring Attachment and Die Mounting

Figure 7:
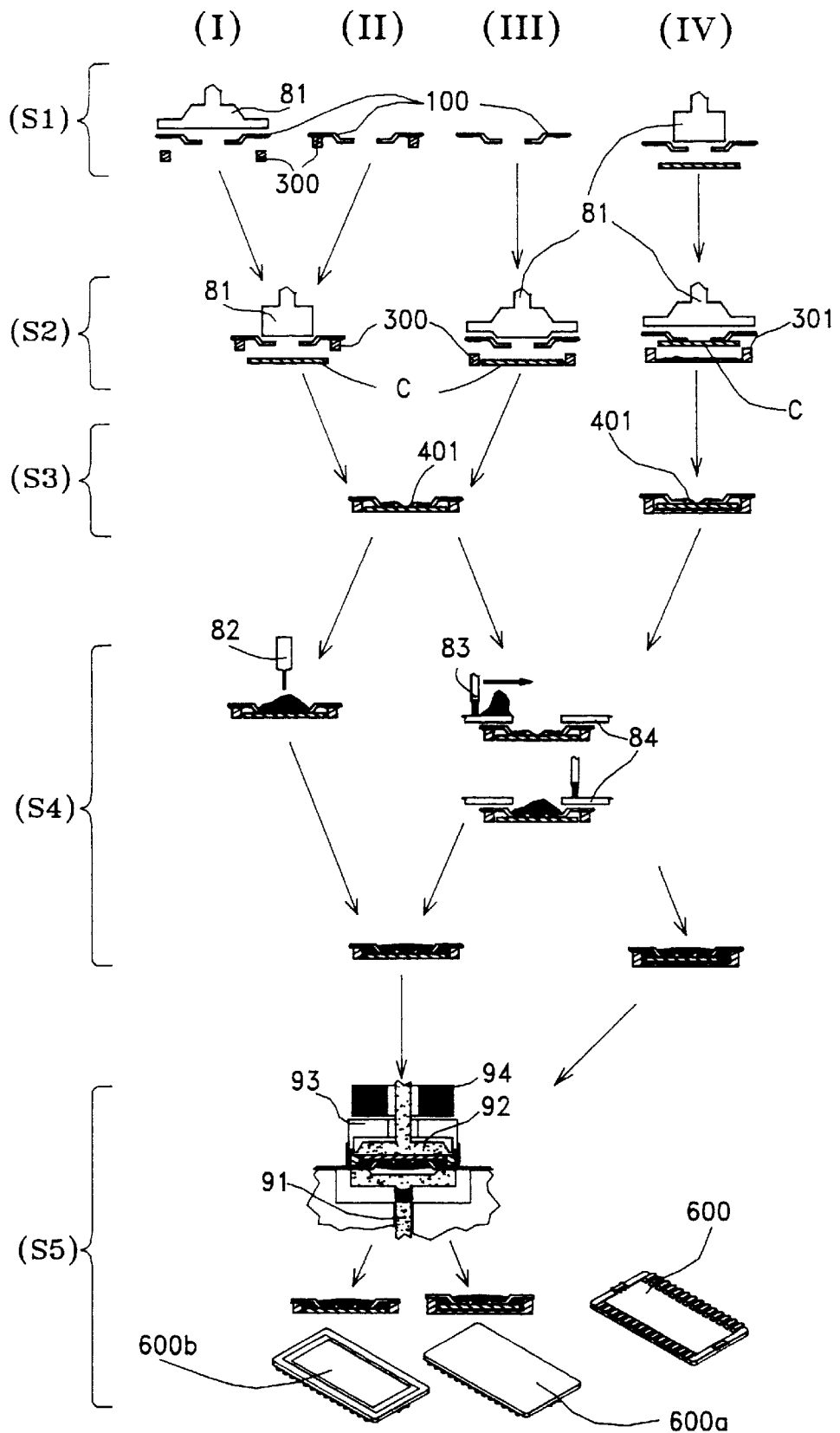
FIG. 7 is a schematic diagram illustrating the steps involved in the method of the present invention for packaging a semiconductor chip.

In FIG. 7, the reference numeral (S1) indicates the schematic illustrations depicting the step of ring attachment, and (S2) indicates the schematic illustrations depicting the step of die mounting. There are four embodiments of steps 1 and 2 as respectively indicated by the reference numerals (I), (II), (III), and (IV).

Figure 8:
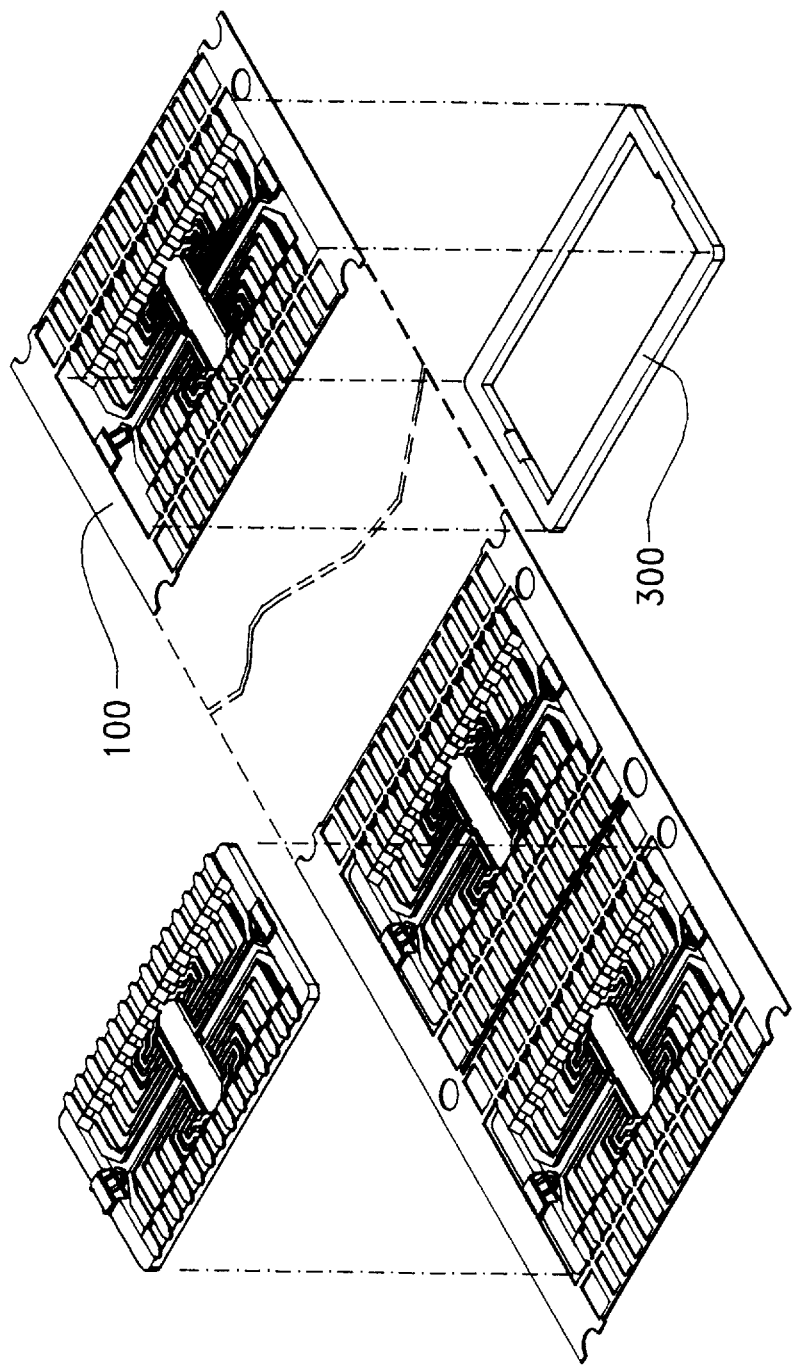
FIG. 8 shows the step of ring attachment.
Figure 9A:
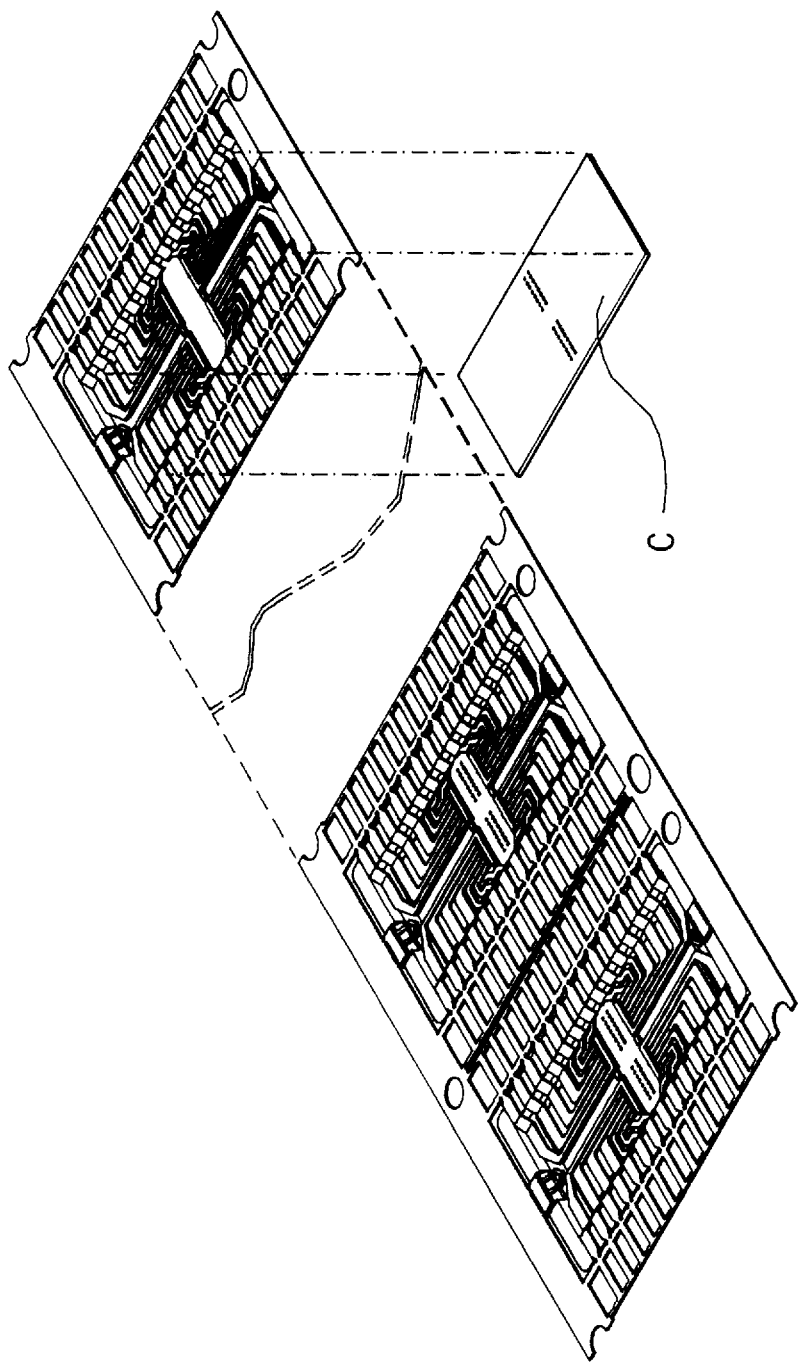
FIGS. 9A and 9B shows the step of die (chip) mounting.
Figure 9B:
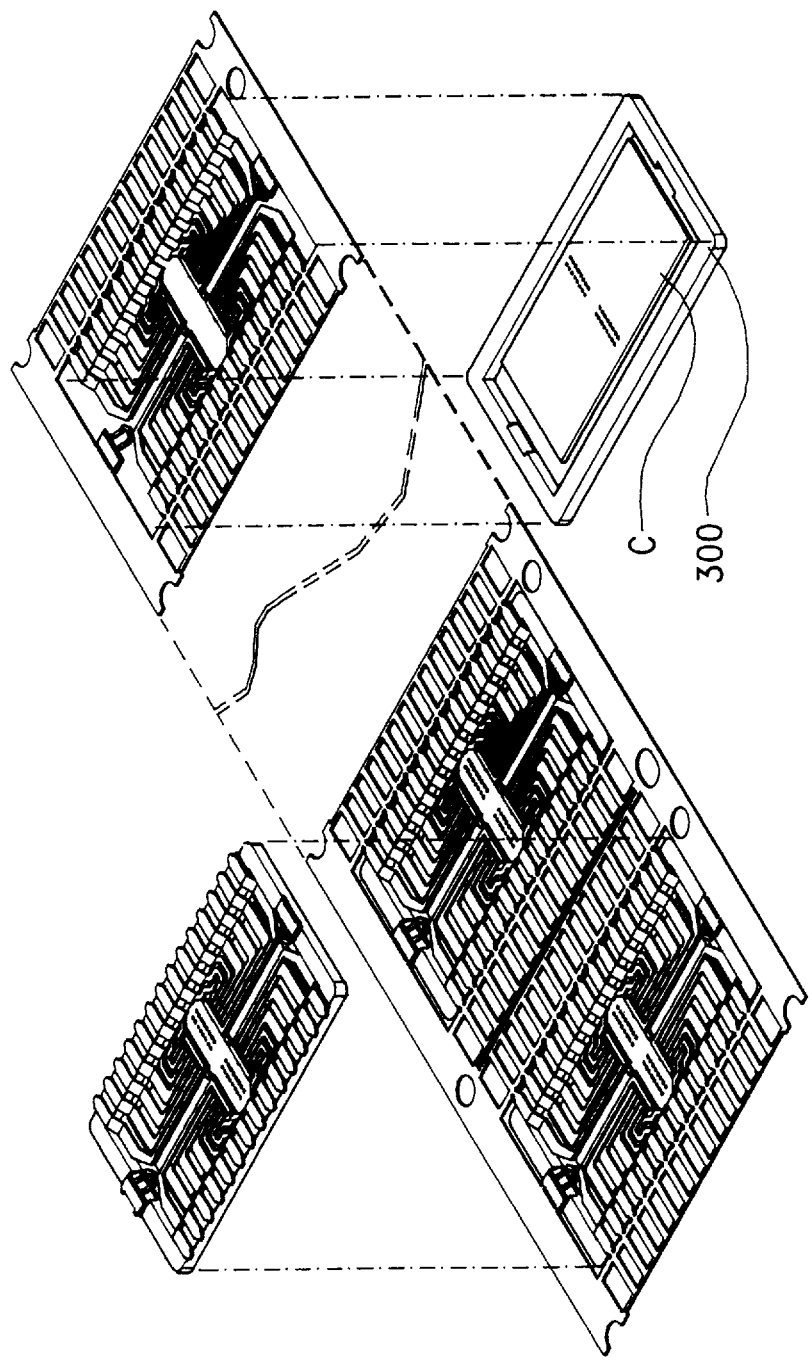

In the first embodiment (I), the leadframe 100 is attached to the ring 300 through heat press by a heating head 81. This process is further illustrated in perspective view in FIG. 8. After that, the semiconductor chip C is mounted on the leadframe 100 and this process is further illustrated in perspective view in FIG. 9A.

In the second embodiment (II), the leadframe 100 is a custom-made type having a factory-attached ring 300. The semiconductor chip C is then mounted on the leadframe 100 through heat press by means of the heating head 81. This process is further illustrated in perspective view in FIG. 9A.

In the third embodiment (III), the leadframe 100, the ring 300, and the semiconductor chip C are attached together through heat press by the heating head 81. This process is further illustrated in perspective view in FIG. 9A.

In the fourth embodiment (IV), a metal cover 301 is used instead of the ring 300. First, the heating head 81 is used to mount the semiconductor chip C on the metal cover 301, and then the leadframe 100 and the metal cover 301 are attached together through heat press by the heating head 81.

Step 3

Wire Bonding

Figure 10:
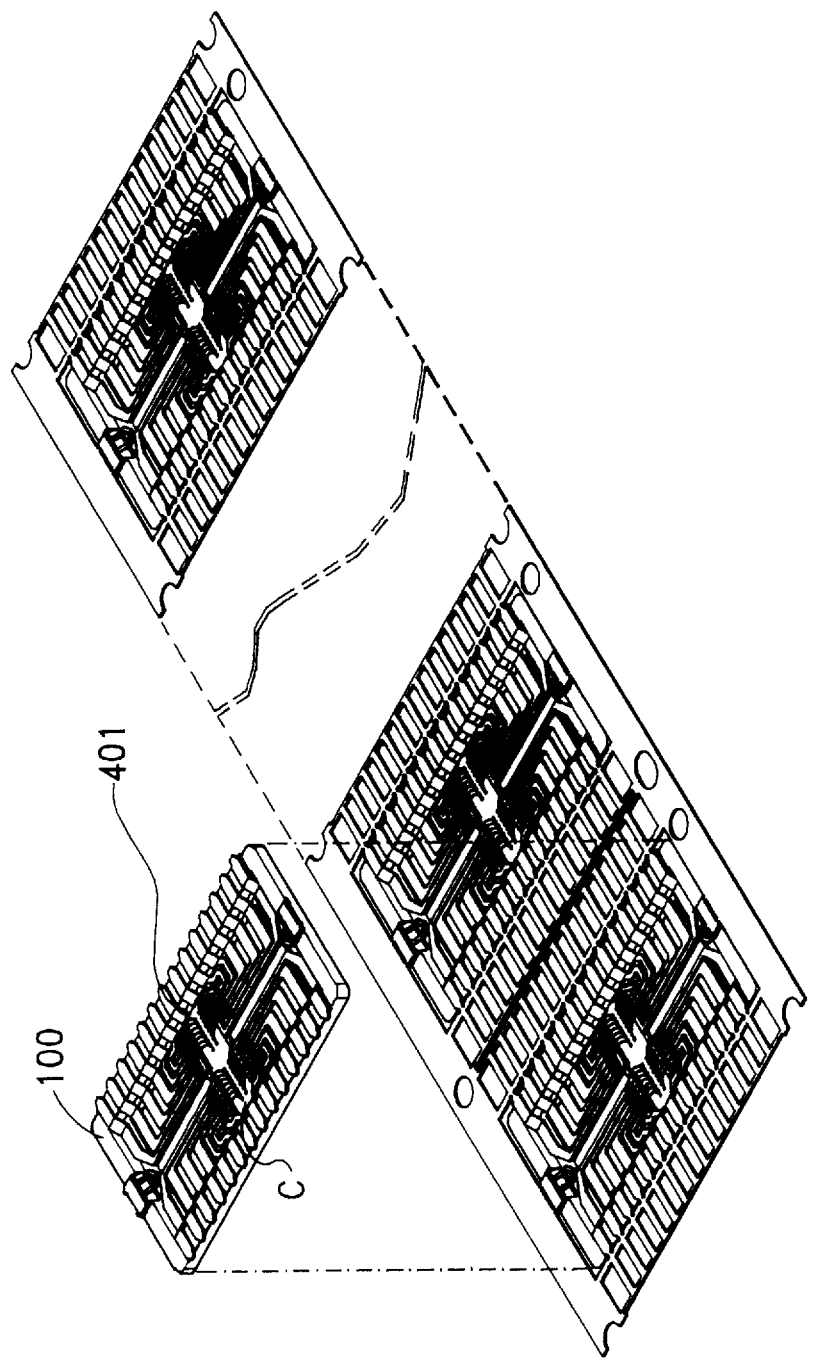
FIG. 10 shows the step of wire bonding.

In FIG. 7, the reference numeral (S3) indicates the schematic illustrations depicting the step of wire bonding, and a perspective view of the same is further illustrated in FIG. 10. The purpose of this step is to interconnect a plurality of bonding wires 401 between the leads on the leadframe 100 and the bonding pads on the semiconductor chip C.

Step 4

Encapsulation

In FIG. 7, the reference numeral (S4) indicates the schematic illustrations depicting the step of encapsulation. In accordance with the present invention, the step of encapsulation can be carried out either by epoxy dispensing or by print encapsulation system (PES). Either way, a liquid epoxy is applied to the semiconductor chip C so as to form a molding compound that enclose the semiconductor chip C. The epoxy dispensing process is further illustrated in perspective view in FIG. 11A, and the PES process is further illustrated in perspective view in FIG. 11B.

Figure 11A:
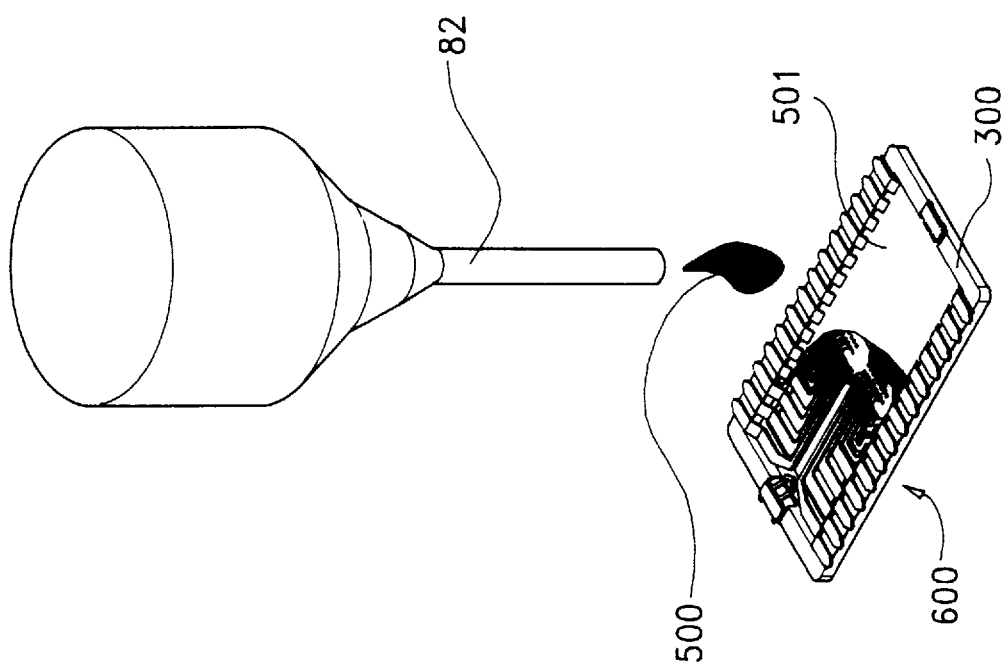
FIGS. 11A and 11B shows the step of encapsulation.

In the epoxy dispensing process, a dispenser 82 is used to apply a liquid sealing resin 500 onto the semiconductor chip C. The resin will fill up the inside of the ring 300 after a while and then hardened to form a molding compound 501 enclosing the semiconductor chip C, as illustrated in FIG. 11A.

Figure 11B:
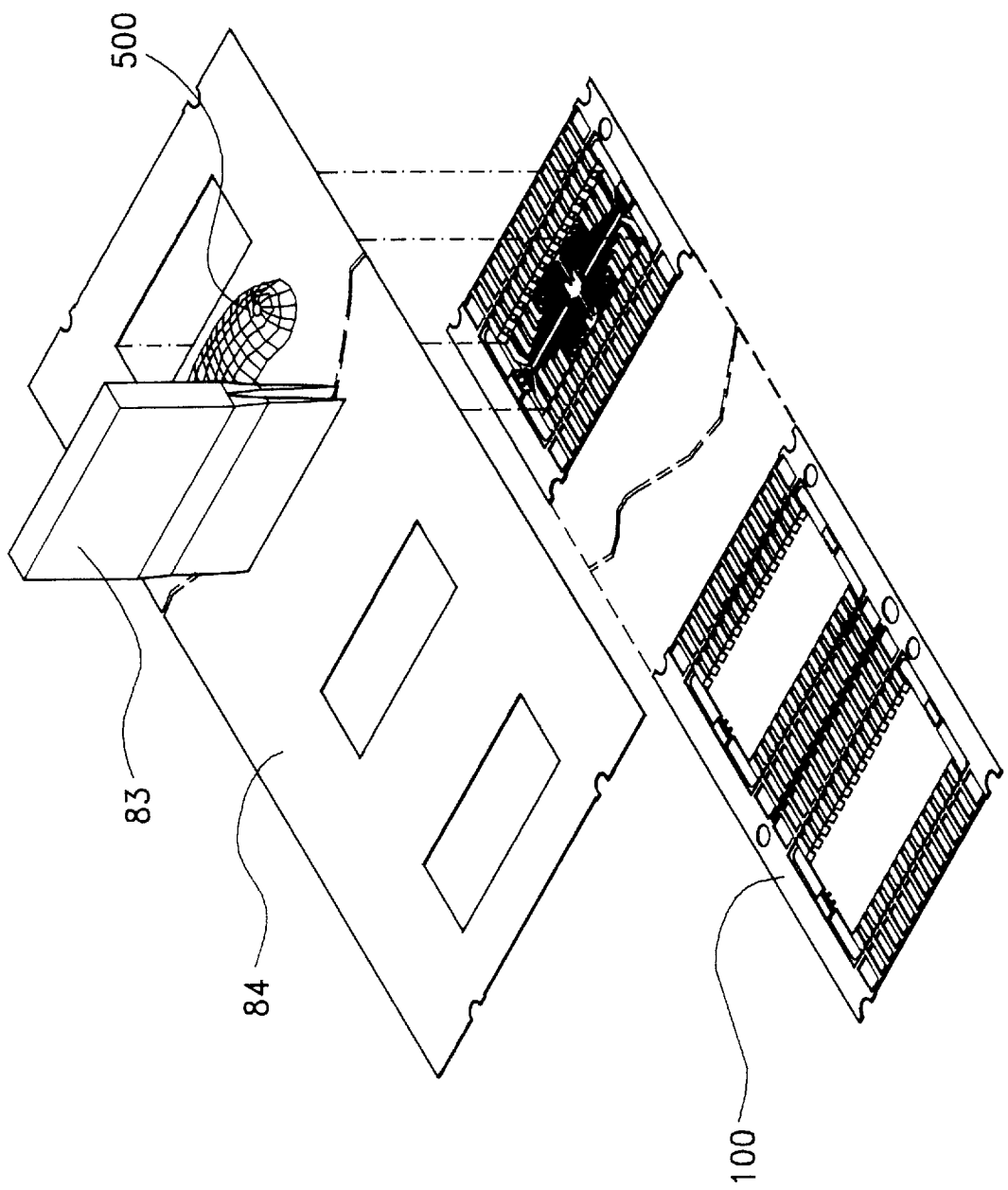

In the PES process, a squeegee 83 and a screen 84 are used together to add the liquid sealing resin 500 to the inside of the ring 300 so as to form a molding compound 501 enclosing the semiconductor chip C, as illustrated in FIG. 11B. The molding compound 501 together with the leadframe 100 and the semiconductor chip C enclosed therein form an IC package 600.

In embodiments (I), (II), (III), the resulted component of the step of encapsulation is illustrated in FIG. 13A, and in embodiment (IV), the resulted component of the step of encapsulation is illustrated in FIG. 13B.

Step 5

Component Punch-out

Figure 12:
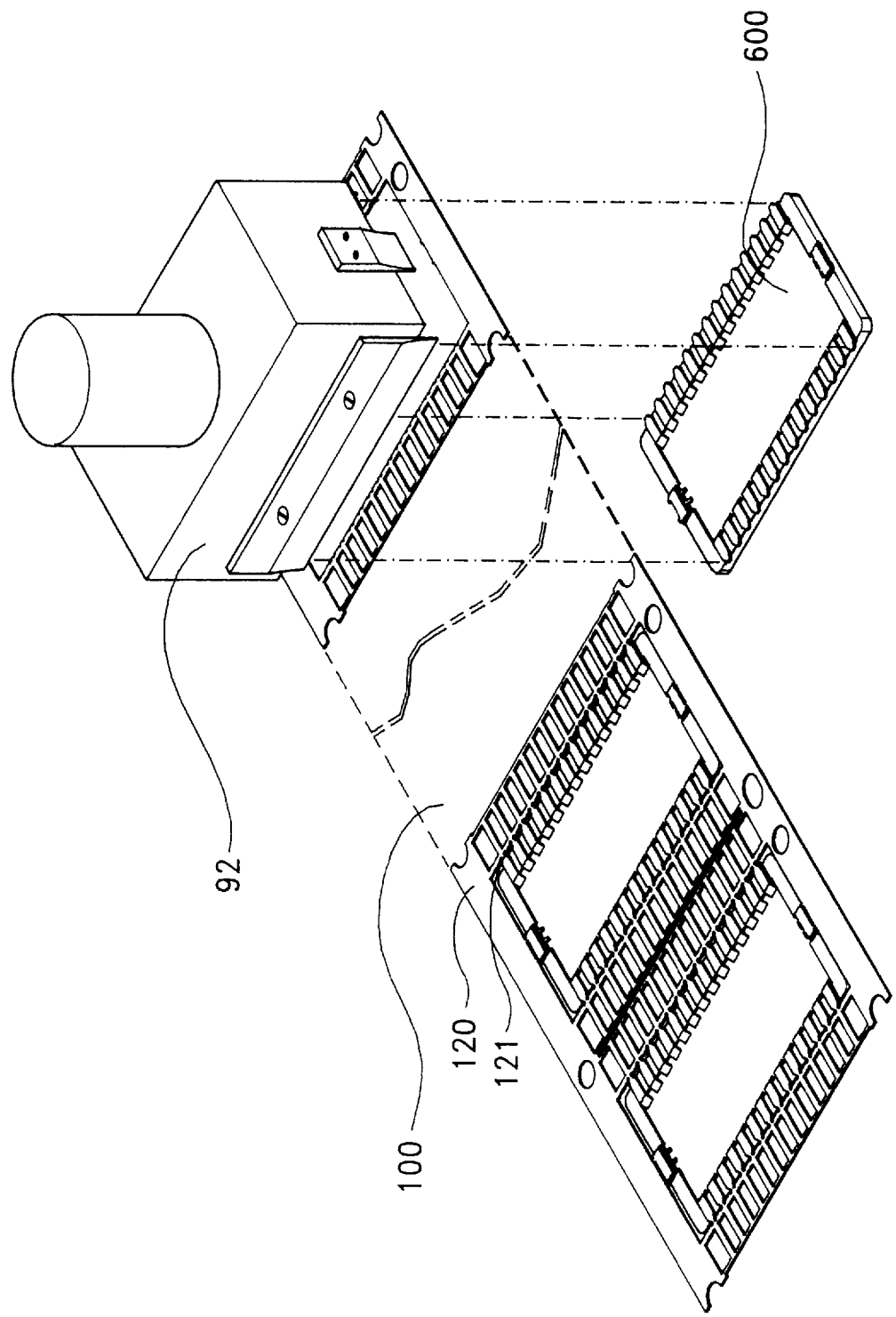
FIG. 12 shows the step of component punch-out.

In FIG. 7, the reference numeral (S5) indicates the schematic illustrations depicting the step of component punch-out, and a perspective view of the same is further illustrated in FIG. 12. The purpose of this step is to remove the side rail 120 from the leadframe 100. The leadframe 100 is mounted on a first fixture 91, and then a second fixture 92 is used to secure the leadframe 100 firmly. After that, a cutting implement 93 is placed in the circular cutaway portions 121. Under this setup, a weighty block 94 punches forcefully downwards on the cutting implement 93. As a result, the IC package 600 is forced to be separated and moved away from the side rail 120, leaving the side rail 120 on the fixtures 91, 92. The side rail 120 is thus removed.

Figure 17:
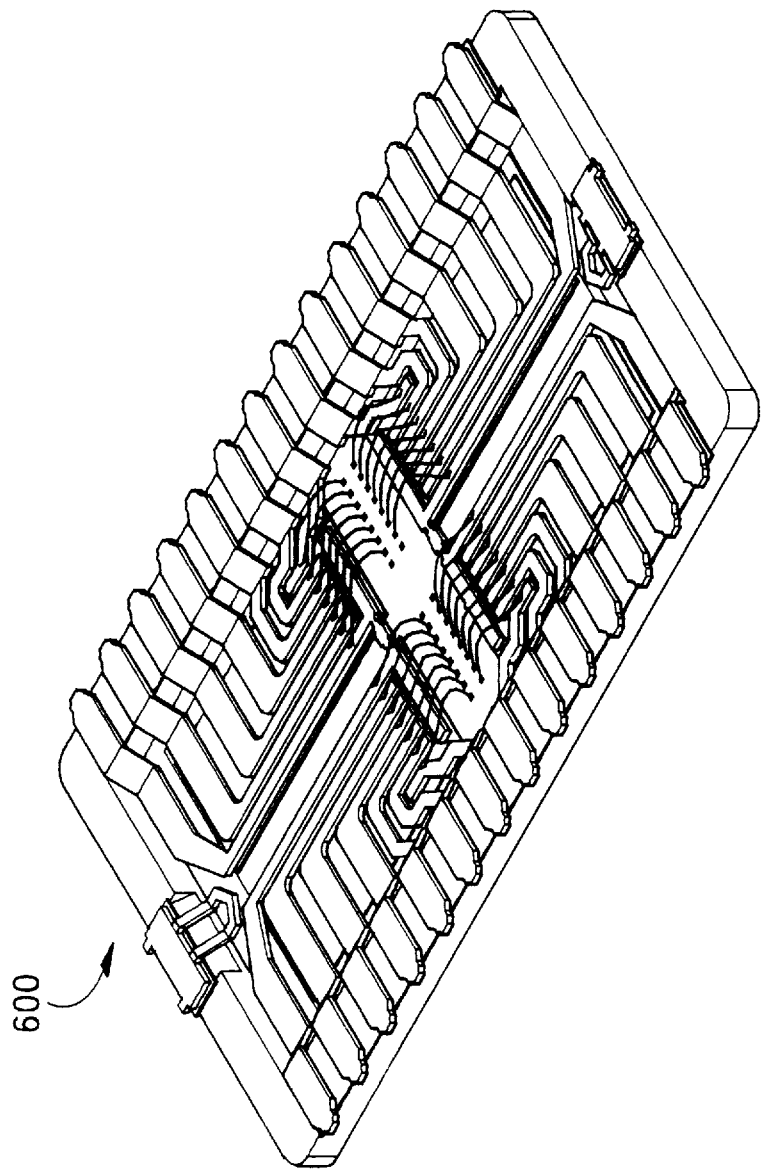
FIG. 17 is an enlarged top view of an IC package.
Figure 18:
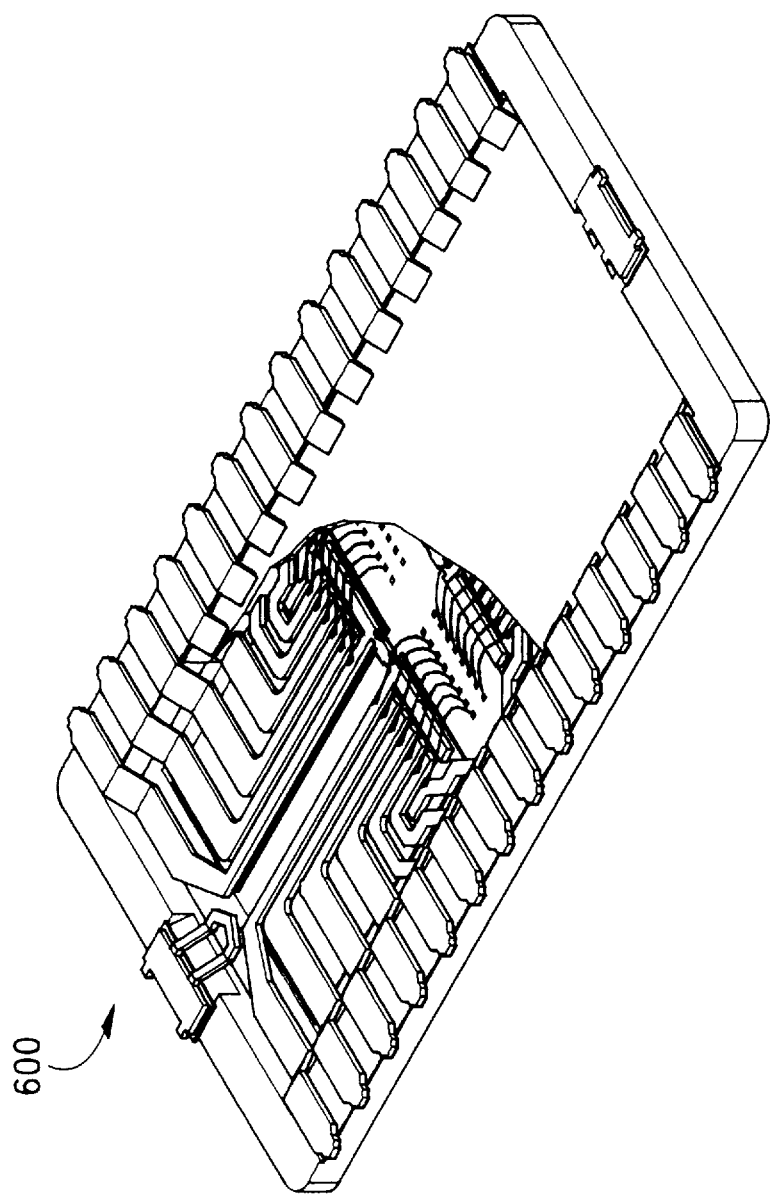
FIG. 18 is a perspective view of the IC package of FIG. 17 which has its cover removed to show the inside structure.

FIG. 17 shows an enlarged view of the IC package 600 made by the foregoing method of the present invention. FIG. 18 further shows the inside structure of the IC package 600.

Compared to prior art methods, the foregoing method excludes the dambar cut and lead forming steps and uses small-scale encapsulating equipment. These benefits allows the manufacturing of the IC packages made by the method of the present invention to be much less costly while much more reliable than the prior art.

The present invention has been described hitherto with exemplary preferred embodiments. However, it is to be understood that the scope of the present invention is limited to the disclosed preferred embodiments. On the contrary, it is intended to cover various modifications and similar arrangements within the scope defined in the following appended claims. The scope of the claims should be accorded the broadest interpretation so as to encompass all such modifications and similar arrangements.

What is claimed is:

1. A method for packaging at least a semiconductor chip in a package, the semiconductor chip having a plurality of I/O pads thereon and being mounted based on a lead-on-chip architecture on a leadframe, said method comprising the steps of:

(1) a first step of ring attachment in which a ring is attached to the leadframe through head press by a heating head, the leadframe having a plurality of leads, a side rail at least a first connecting piece and a second connecting piece and a plurality of circular cutaway portions between the leads and the side rail, the first connecting piece and the second connecting piece being selectively removed in accordance with the arrangement of the plurality of I/O pads and power/ground connection on the semiconductor chip;

(2) a second step of die mounting in which the semiconductor chip is mounted on the leadframe through head press by a heating head;

(3) a third step of wire bonding in which a plurality of wires are interconnected between the semiconductor chip and the leadframe in accordance with the connecting relation of the first connecting piece and the second connecting piece and the leadframe:

(4) a fourth step of encapsulation in which encapsulation is implemented by an epoxy dispensing process, a liquid epoxy being applied to the semiconductor chip so as to form a molding compound encapsulating the semiconductor chip; and (5) a fifth step of component punch-out in which the side rail is removed from the leadframe.

2. The method as claimed in claim 1, in said first and second steps, wherein the heating head is used to attach the ring to the leadframe, and also heat press is used to mount the semiconductor chip on the leadframe.

3. The method as claimed in claim 1, in said first and second steps, wherein the leadframe is custom-made with a pre-attached ring, and the heating head is used to heat press the semiconductor chip onto the leadframe.

4. The method as claimed in claim 1, in said first and second steps, wherein the leadframe, the ring, and the semiconductor chip are together attached to the leadframe by means for heat press by the heating head.

5. The method as claimed in claim 1, in said first and second steps, wherein a metal cover is used for mounting the semiconductor chip thereon, and the leadframe and the metal cover are attached together through heat press by the heating head.

6. The method as claimed in claim 1, in the third step, wherein the I/O pads on the semiconductor chip are arranged crosswise in two rows about the crosswise center line of the semiconductor chip, the first connecting piece being cut away.

7. The method as claimed in claim 1, in the third step, wherein the I/O pads on the semiconductor chip are arranged lengthwise in one row along the lengthwise center line of the semiconductor chip, the second connecting piece being cut away.

8. The method as claimed in claim 1, in the third step, wherein no specific I/O pads are arranged on the semiconductor chip, the first and second connecting pieces being both cut away.

9. The method as claimed in claim 1, in the epoxy dispensing process of the fourth step, wherein a dispenser is used to apply the liquid epoxy onto the semiconductor chip, the liquid epoxy filling up the inside of the ring to form the molding compound enclosing the semiconductor chip.

10. The method as claimed in claim 1 wherein the fifth step of punch-out includes the steps of;
   mounting the leadframe securely on a first fixture and a second fixture; placing a cutting implement in the circular cutaway portions, and punching a weighty block forcefully on the cutting implement so as to remove the side rail.

11. The method as claimed in claim 1, in said first step wherein the ring is a separate member.

12. The method as claimed in claim 1, in said first step wherein the ring is formed by means of dispensing an epoxy resin of high viscosity near the circular cutaway portion.

13. The method as claimed in claim 1, in said first and second steps, wherein the leadframe, the ring, and the semiconductor chip are together attached to the leadframe by means of heat press by the heating head.

14. The method as claimed in claim 1, in said first and second steps, wherein a metal cover is used for mounting the semiconductor chip thereon, and the leadframe and the metal cover are attached together through heat press by the heating head.

15. The method as claimed in claim 1, in the third step, wherein the I/O pads on the semiconductor chip are arranged crosswise in two rows about the crosswise center of the semiconductor chip, the first connecting piece being cut away.

16. A method for packaging at least a semiconductor chip in a package, the semiconductor chip having a plurality of I/O pads thereon and being mounted based on a lead-on-chip architecture on a leadframe, said method comprising the steps of:

(1) a first step of ring attachment in which a ring is attached to the leadframe through head press by a heatinghead, the leadframe having a plurality of leads, a side rail, at least a first connecting piece and a second connecting piece and a plurality of circular cutaway portions between the leads and the side rail, the first connecting piece and the second connecting piece being selectively removed in accordance with the arrangement of the plurality of I/O pads and a power/ground connections on the semiconductor chip;

(2) a second step of die mounting in which the semiconductor chip is mounted on the leadframe through head press by a heating head;

(3) a third step of wire bonding in which a plurality of wires are interconnected between the semiconductor chip and the leadframe in accordance with the connecting relation of the first connecting piece and the second connecting piece and the leadframe;

(4) a fourth step of encapsulation in which encapsulation is implemented by a print encapsulation system (PES) process, a liquid epoxy being applied to the semiconductor chip so as to form a molding compound encapsulating the semiconductor chip; and (5) a fifth step of component punch-out in which the side rail is removed from the leadframe.

17. The method as claimed in claim 10, in said first and second steps, wherein the heating head is used to attach the ring to the leadframe and also heat press is used to mount the semiconductor chip on the leadframe.

18. The method as claimed in claim 10, in said first and second steps, wherein the leadframe is custom-made with a pre-attached ring, and the heating head is used to heat press the semiconductor chip onto the leadframe.

19. The method as claimed in claim 16, in the third step, wherein the I/O pads on the semiconductor chip are arranged lengthwise in one row along the lengthwise center line of the semiconductor chip, the second connecting piece being cut away.

20. The method as claimed in claim 16, in the third step, wherein no specific I/O pads are arranged on the semiconductor chip, the first and second connecting pieces being both cut away.

21. The method as claimed in claim 16, in the PES process of the fourth step, wherein a squeegee and a screen are used together to add the liquid epoxy to the inside of the ring so as to form the molding compound enclosing the semiconductor chip.

22. The method as claimed in claim 16, wherein the fifth step of punch-out includes the steps of:
   mounting the leadframe securely on a first fixture and a second fixture;
   placing a cutting implement in the circular cutaway portions, and punching a weighty block forcefully on the cutting implement so as to remove the side rail.

23. The method as claimed in claim 16, in said first step, wherein the ring is a separate member.

24. The method as claimed in claim 16, in said first step, wherein the ring is formed by means of dispensing an epoxy resin of high viscosity near the circular cutaway portion.

* * * * *